(12) United States Patent
Suzuki

(10) Patent No.: US 11,646,229 B2
(45) Date of Patent: May 9, 2023

(54) PROCESSING METHOD OF DEVICE WAFER

(71) Applicant: DISCO CORPORATION, Tokyo (JP)

(72) Inventor: Minoru Suzuki, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 214 days.

(21) Appl. No.: 17/172,316

(22) Filed: Feb. 10, 2021

(65) Prior Publication Data
US 2021/0265211 A1  Aug. 26, 2021

(30) Foreign Application Priority Data
Feb. 21, 2020 (JP) .............................. JP2020-028810

(51) Int. Cl.
| | |
|---|---|
| *H01L 21/78* | (2006.01) |
| *H01L 21/02* | (2006.01) |
| *H01L 21/268* | (2006.01) |
| *H01L 21/683* | (2006.01) |
| *H01L 23/544* | (2006.01) |
| *H01L 21/3065* | (2006.01) |

(52) U.S. Cl.
CPC ........ *H01L 21/78* (2013.01); *H01L 21/02079* (2013.01); *H01L 21/268* (2013.01); *H01L 21/3065* (2013.01); *H01L 21/6836* (2013.01); *H01L 23/544* (2013.01); *H01L 2221/68336* (2013.01); *H01L 2223/5446* (2013.01)

(58) Field of Classification Search
None
See application file for complete search history.

(56) References Cited

U.S. PATENT DOCUMENTS

| | | | | |
|---|---|---|---|---|
| 2004/0048415 | A1* | 3/2004 | Horie | H01L 24/97 257/E23.021 |
| 2004/0266138 | A1* | 12/2004 | Kajiyama | H01L 24/27 257/E21.599 |
| 2010/0015784 | A1* | 1/2010 | Nakamura | B23K 26/042 438/464 |
| 2012/0187076 | A1* | 7/2012 | Dolan | B41J 2/1631 216/13 |
| 2012/0242756 | A1* | 9/2012 | Nystrom | B41J 2/161 29/25.35 |

(Continued)

FOREIGN PATENT DOCUMENTS

JP     2015019525 A     1/2015

*Primary Examiner* — Ali Naraghi
*Assistant Examiner* — Siangluai Mang
(74) *Attorney, Agent, or Firm* — Greer Burns & Crain Ltd.

(57) ABSTRACT

A processing method of a device wafer includes a mask coating step of coating a front surface of the device wafer with a water-soluble resin, a mask forming step of applying a laser beam along each division line, forming a groove, and removing a protective mask and a functional layer to expose a substrate, a plasma etching step of forming a division groove that divides the substrate along the groove by supplying a gas in a plasma condition, an expanding step of expanding a protective tape in a plane direction to expand a width of the division groove, an adhesive film dividing step of applying a laser beam along the division groove to divide the adhesive film that has been exposed due to the formation of the division groove, and a cleaning step of cleaning and removing the water-soluble resin.

5 Claims, 11 Drawing Sheets

(56) References Cited

U.S. PATENT DOCUMENTS

| | | | |
|---|---|---|---|
| 2013/0087949 A1* | 4/2013 | Kitahara | H01L 21/6836 264/400 |
| 2014/0141596 A1* | 5/2014 | Matsuzaki | B23K 26/40 438/462 |
| 2016/0133519 A1* | 5/2016 | Holden | H01L 21/67207 438/462 |
| 2016/0365283 A1* | 12/2016 | Lei | H01L 21/31105 |
| 2017/0256500 A1* | 9/2017 | Park | B23K 26/0624 |
| 2018/0185964 A1* | 7/2018 | Yokoi | B23K 26/351 |

* cited by examiner

PROCESSING METHOD OF DEVICE WAFER

BACKGROUND OF THE INVENTION

Field of the Invention

The present invention relates to a processing method of a device wafer.

Description of the Related Art

There has been known a technique in which a device chip with a film attached thereon is used for a device chip to be often used in a package such as a flash memory. Such device chip with a film attached thereon is obtained by attaching an adhesive film called a die attach film (DAF) to a back surface of a device wafer and then dividing the wafer together with the adhesive film into individual pieces. Moreover, such a technique has been known that, after a plurality of the device chips with the film attached thereon are stacked on top of another, the stacked device chips in plural layers are covered with a mold resin to be packaged. For dividing this device wafer, a processing method using a plasma dicing technique capable of making division grooves smaller in width has been examined.

SUMMARY OF THE INVENTION

However, since dicing of the adhesive film by plasma etching is more difficult than a silicon substrate, it is required to divide the adhesive film with a blade or laser, instead of plasma etching. In addition, the adhesive film which is exposed at a bottom of a division groove having a small width which has been formed by plasma etching is less likely to be cut in with a blade or laser, causing difficulty in processing. Moreover, cutting or laser processing of the adhesive film causes a burr or debris, thereby causing a problem that such debris is attached to a side surface or a device surface of the device chip.

Accordingly, it is an object of the present invention to provide a processing method of a device wafer in which the device wafer with an adhesive film attached thereon can easily be divided into device chips.

In accordance with an aspect of the present invention, there is provided a processing method of a device wafer which has a functional layer layered on a front surface of a substrate, the functional layer having a plurality of devices and a plurality of division lines formed therein, the plurality of division lines demarcating the plurality of devices and crossing each other. The processing method of a device wafer includes a mask coating step of coating, after a state in which an adhesive film for die-bonding attached to a back surface of the device wafer is attached to a front surface of a protective tape mounted to an annular frame is prepared, a front surface of the device wafer with a water-soluble resin as a protective mask, a mask forming step of, after the mask coating step is carried out, applying a laser beam to the front surface of the device wafer, forming a groove along each of the division lines by ablation processing, and removing the protective mask and the functional layer to expose the substrate, a plasma etching step of, after the mask forming step is carried out, supplying a gas in a plasma condition to the front surface of the device wafer to form a division groove that divides the substrate along the groove, an expanding step of, after the plasma etching step is carried out, expanding the protective tape in a plane direction to expand a width of the division groove, an adhesive film dividing step of, after the expanding step is carried out, applying a laser beam to the adhesive film that has been exposed due to the formation of the division groove, and dividing the adhesive film along the division groove by ablation processing, and a cleaning step of, after the adhesive film dividing step is carried out, cleaning and removing the water-soluble resin.

Preferably, the processing method of a device wafer further includes an additional coating step of applying the water-soluble resin to the device wafer that has the division groove formed therein, after the plasma etching step is carried out and before the adhesive film dividing step is carried out.

According to the present invention, it is possible to easily divide a device wafer with an adhesive film attached thereon into individual device chips.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A preferred embodiment of the present invention will now be described in detail with reference to the drawings. The present invention is not limited to this preferred embodiment. Further, the components used in this preferred embodiment may include those that can be easily assumed by persons skilled in the art or substantially the same elements as those known in the art. Further, the configurations described below may be suitably combined. Further, the configurations may be variously omitted, replaced, or changed without departing from the scope of the present invention.

Figure 1:
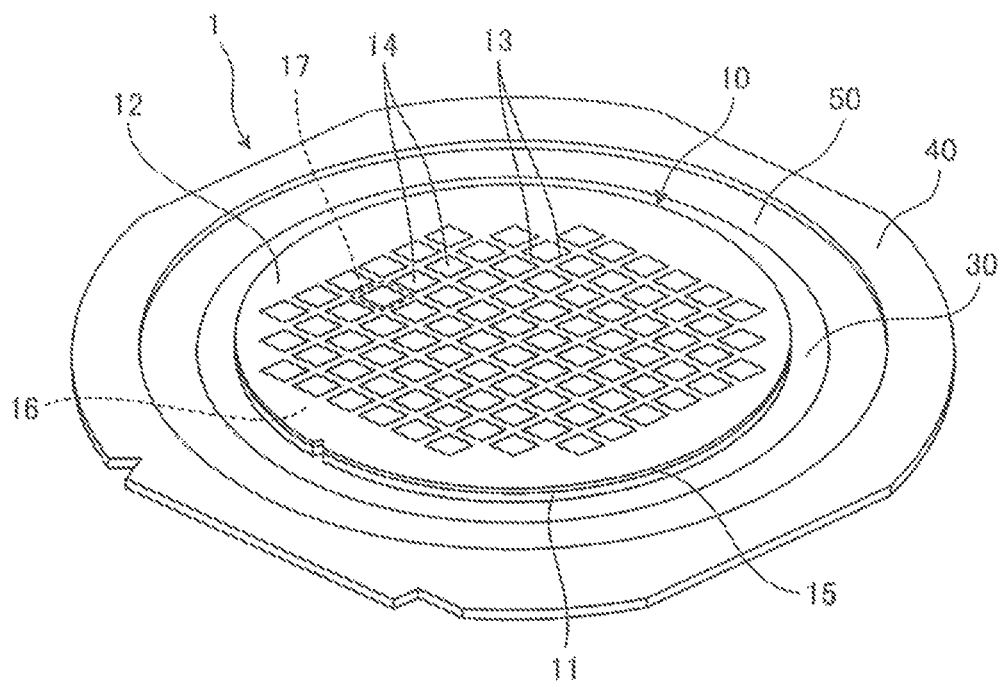
FIG. 1 is a perspective view illustrating an example of a frame unit including an object to be processed in a processing method of a device wafer according to a preferred embodiment.

A processing method of a device wafer 10 according to the preferred embodiment of the present invention will be described below with reference to the attached drawings. First, a configuration of a frame unit 1 including an object to be processed in the preferred embodiment will be described. FIG. 1 is a perspective view illustrating an example of the frame unit 1 including the object to be processed in the processing method of the device wafer 10 according to the preferred embodiment.

As illustrated in FIG. 1, the frame unit 1 includes the device wafer 10 as the object to be processed according to the preferred embodiment, an adhesive film 30, an annular frame 40, and a protective tape 50. The device wafer 10 is a wafer such as a disc-shaped semiconductor wafer having a substrate 11 formed of silicon (Si), gallium arsenide (GaAs), or the like or an optical device wafer. The device wafer 10 has a plurality of division lines 13 formed in a front surface 12 thereof, and a plurality of devices 14 formed in respective separate regions defined by the plurality of division lines 13 crossing each other in a grid manner.

The device 14 is, for example, an integrated circuit (IC) or a large scale integration (LSI), an image sensor such as a charge coupled device (CCD) or a complementary metal oxide semiconductor (CMOS), or micro electro mechanical systems (MEMS).

In addition, the device wafer 10 has a functional layer 15 layered over a front surface of the substrate 11. The functional layer 15 includes a plurality of low-dielectric insulating films (hereinafter, referred to as low-k films) formed of an inorganic film such as fluorine-doped silicon oxide (SiOF) or boron-doped silicon oxide (BSG (SiOB)) or an organic film that is a polymer film such as polyimide or parylene, and a plurality of conductive films formed of a conductive metal. The low-k films and the conductive films are layered one another, forming the device 14. The conductive film configures a circuit in the device 14. Accordingly, the device 14 includes the low-k films layered each other, and the conductive films layered between the low-k films. Note that a portion of the functional layer 15 corresponding to each of the division lines 13 is formed of the low-k film and does not include a conductive film, except for test element groups (TEGs). The TEGs are elements for evaluation in order to find a problem in design or manufacture occurring in the device 14.

The adhesive film 30 for die bonding is attached to a back surface 16 of the device wafer 10. The adhesive film 30 is larger than an outer diameter of the device wafer 10 so as to cover the whole area of the back surface 16 of the device wafer 10. The device wafer 10 is divided along the division lines 13 in a state in which the adhesive film 30 is attached to the back surface 16, into a plurality of device chips 17 with the adhesive film 30 attached thereto each including each of the devices 14.

The device wafer 10 and the adhesive film 30 are supported by the annular frame 40 and the protective tape 50. The annular frame 40 has an opening having a diameter larger than the outer diameter of each of the device wafer 10 and the adhesive film 30. The annular frame 40 is formed of a metal, resin, or the like which are resistant to plasma etching. The protective tape 50 includes a base layer formed of a synthetic resin having an insulating property, and an adhesive layer layered over at least any one of a front surface and a back surface of the base layer and having adhesion. The protective tape 50 is attached to the back surface side of the annular frame 40 at an outer periphery thereof. The device wafer 10 is positioned at a predetermined position inside the opening of the annular frame 40, and the back side (lower side) of the adhesive film 30 attached to the back surface 16 of the device wafer 10 is attached to the front side (upper side) of the protective tape 50, whereby the device wafer 10 is fixed to the annular frame 40 through the protective tape 50.

Figure 2:
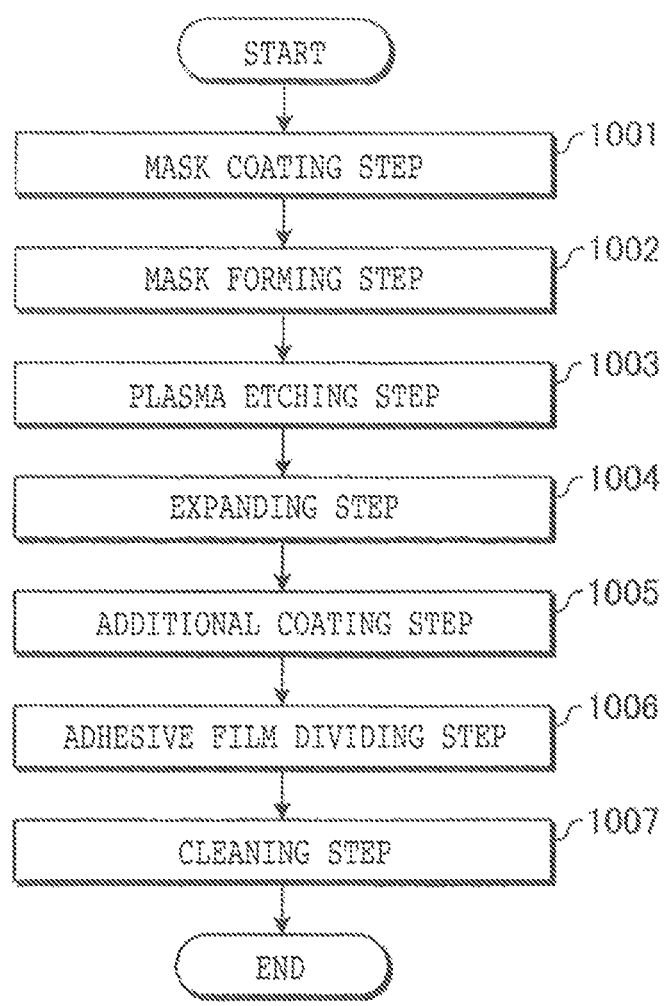
FIG. 2 is a flowchart indicating a flow of the processing method of a device wafer according to the preferred embodiment.

Next, the processing method of the device wafer 10 according to the preferred embodiment will be described. FIG. 2 is a flowchart indicating a flow of the processing method of the device wafer 10 according to the preferred embodiment. The processing method of the device wafer 10 includes a mask coating step 1001, a mask forming step 1002, a plasma etching step 1003, an expanding step 1004, an additional coating step 1005, an adhesive film dividing step 1006, a cleaning step 1007.

(Mask Coating Step 1001)

Figure 3:
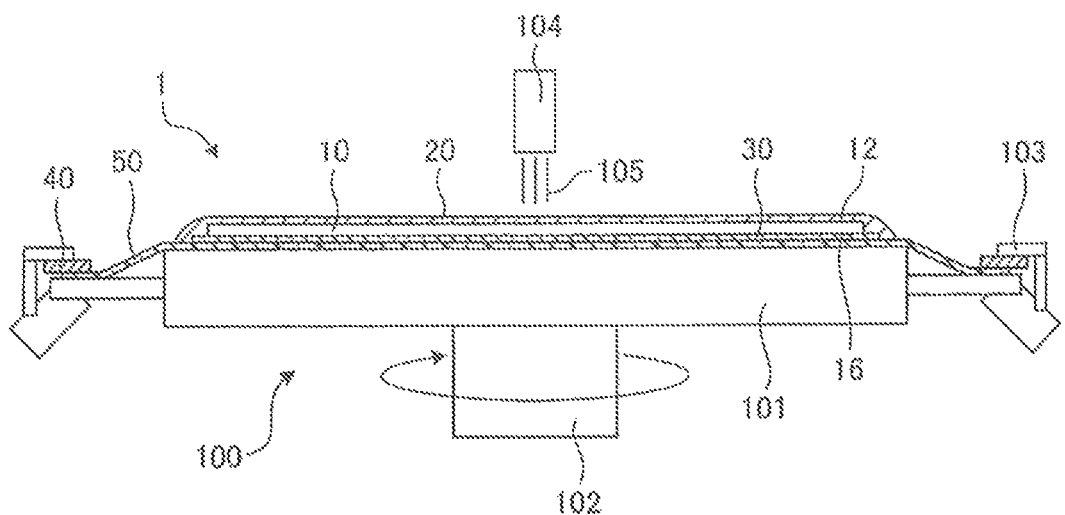
FIG. 3 is a side elevational partial sectional view illustrating an example of a mask coating step indicated in FIG. 2.

FIG. 3 is a side elevational partial sectional view illustrating an example of the mask coating step 1001 indicated in FIG. 2. The mask coating step 1001 is a step of coating the front surface 12 of the device wafer 10 with a water-soluble resin 105 as a protective mask 20.

In the mask coating step 1001, before coating the protective mask 20, prepared is a state in which the back side of the adhesive film 30 attached to the back surface 16 of the device wafer 10 is attached to the front surface of the protective tape 50 mounted to the annular frame 40, as illustrated in FIG. 1. As illustrated in FIG. 3, in the mask coating step 1001 of the preferred embodiment, the front surface 12 of the device wafer 10 is coated with the water-soluble resin 105 by a spin coater 100. The spin coater 100 includes a holding table 101, a rotary shaft 102, a plurality of clamps 103, and a water-soluble resin supplying nozzle 104.

In the mask coating step 1001, first, the adhesive film 30 side of the back surface 16 of the device wafer 10 is held under suction through the protective tape 50 on the holding table 101, and an outer peripheral portion of the annular frame 40 is fixed with the plural clamps 103. In the mask coating step 1001, next, in a state in which the holding table 101 is rotated around an axis thereof with the rotary shaft 102, the water-soluble resin 105 is dropped onto the front surface 12 of the device wafer 10 from the water-soluble resin supplying nozzle 104. At this time, the water-soluble resin supplying nozzle 104 moves in a reciprocating manner in a radial direction of the device wafer 10. The dropped water-soluble resin 105 flows toward the outer periphery from the center on the front surface 12 of the device wafer 10 due to a centrifugal force caused by rotation of the holding table 101, being applied to the whole area of the front surface 12 of the device wafer 10.

The water-soluble resin 105 is a water-soluble resin, for example, polyvinyl alcohol (PVA) or polyvinylpyrrolidone (PVP), which is resistant to plasma etching when being cured. In the mask coating step 1001, the water-soluble resin 105 applied to the whole area of the front surface 12 of the device wafer 10 is dried and cured, whereby a layer of the water-soluble resin 105 which covers the whole area of the front surface 12 of the device wafer 10 is formed. Accordingly, the front surface 12 of the device wafer 10 is coated with the protective mask 20 formed of the layer of the water-soluble resin 105.

(Mask Forming Step 1002)

Figure 4:
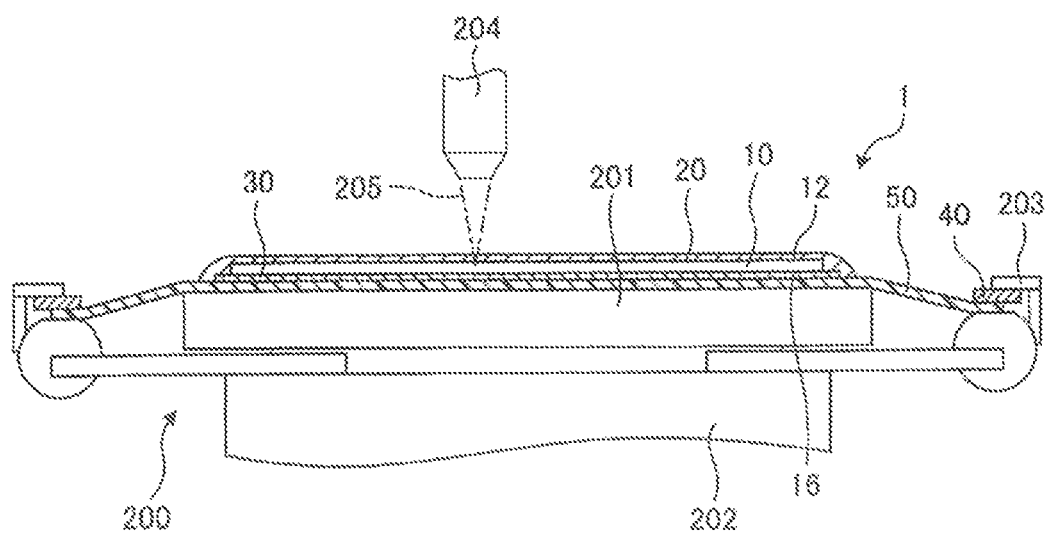
FIG. 4 is a side elevational partial sectional view illustrating an example of a mask forming step indicated in FIG. 2.
Figure 5:
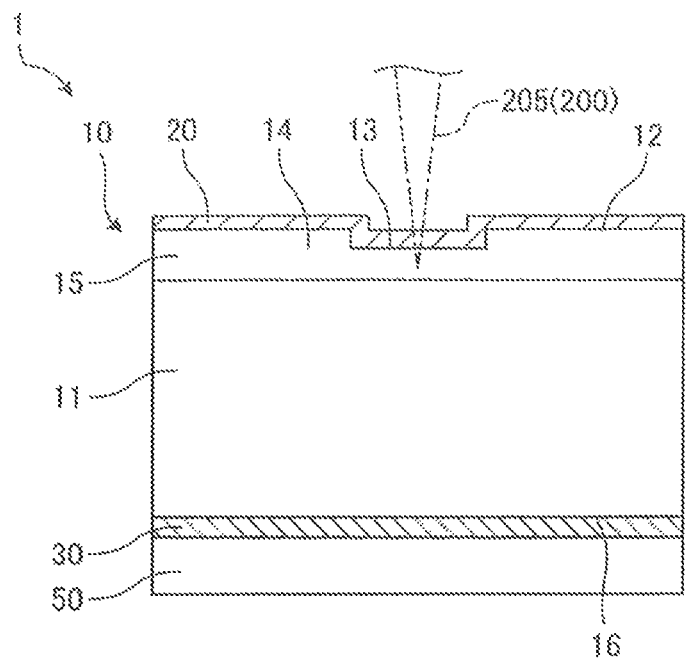
FIG. 5 is a cross-sectional view of a main portion of the device wafer illustrated in FIG. 4.
Figure 6:
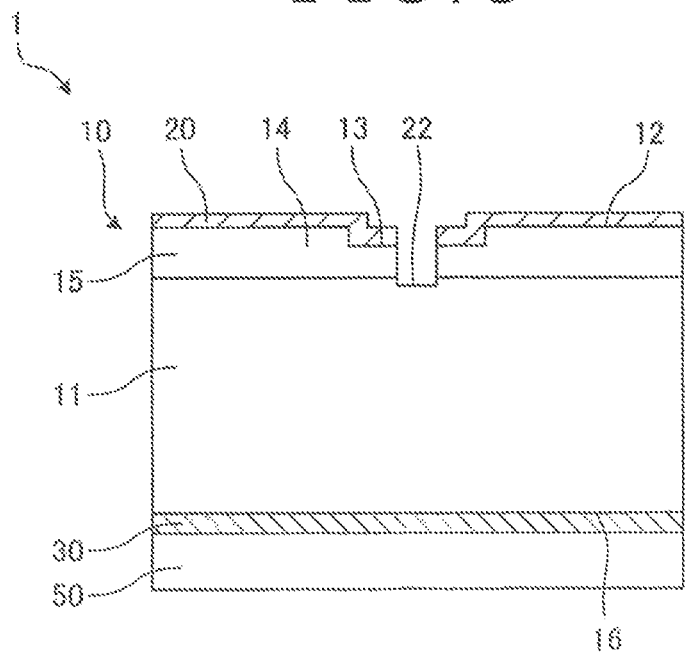
FIG. 6 is a cross-sectional view of a main portion of the device wafer illustrating a state after the mask forming step illustrated in FIG. 4.

FIG. 4 is a side elevational partial sectional view illustrating an example of the mask forming step 1002 indicated in FIG. 2. FIG. 5 is a cross-sectional view of a main portion of the device wafer 10 illustrated in FIG. 4. FIG. 6 is a cross-sectional view of a main portion of the device wafer 10 illustrating a state after the mask forming step 1002 illustrated in FIG. 4. The mask forming step 1002 is carried out after the mask coating step 1001 is carried out. In the mask forming step 1002, a laser beam 205 is applied to the front surface 12 of the device wafer 10 along each of the division lines 13, and the protective mask 20 and the functional layer 15 are removed while a plurality of laser-processed grooves 22 are formed to thereby expose the substrate 11.

As illustrated in FIG. 4, in the mask forming step 1002 of the preferred embodiment, a laser processing apparatus 200 carries out ablation processing to form the laser-processed groove 22 illustrated in FIG. 6 along a corresponding one of the division lines 13 formed in the front surface 12 of the device wafer 10. As illustrated in FIG. 4, the laser processing apparatus 200 includes a holding table 201, a rotary shaft 202, a plurality of clamps 203, a laser beam applying unit 204 including a laser oscillator and a focusing lens, and a moving unit which moves the holding table 201 and the laser beam applying unit 204 relatively.

In the mask forming step 1002, first, the adhesive film 30 side of the back surface 16 of the device wafer 10 is held under suction through the protective tape 50 on the holding table 201, and the outer peripheral portion of the annular frame 40 is fixed with the plurality of clamps 203. In the mask forming step 1002, next, as illustrated in FIG. 5, while the holding table 201 and the laser beam applying unit 204 are moved relatively along each of the division lines 13, the laser beam 205 is applied from the laser beam applying unit 204 to each of the division lines 13 in the front surface 12 of the device wafer 10. The laser beam 205 is a laser beam having an absorption wavelength to the device wafer 10.

As illustrated in FIG. 6, the laser beam 205 removes the protective mask 20 in a region corresponding to each of the division lines 13 within the protective mask 20 covering the whole area of the front surface 12 of the device wafer 10, thereby forming the laser-processed groove 22 in this region. The laser-processed groove 22 removes the protective mask 20, the functional layer 15, and part of the substrate 11 in the region which corresponds to each of the division lines 13 to expose the substrate 11 in this region. Accordingly, the protective mask 20 is formed on the front surface 12 of the device wafer 10 so as to cover each of the devices 14 and expose each of the division lines 13.

(Plasma Etching Step 1003)

Figure 7:
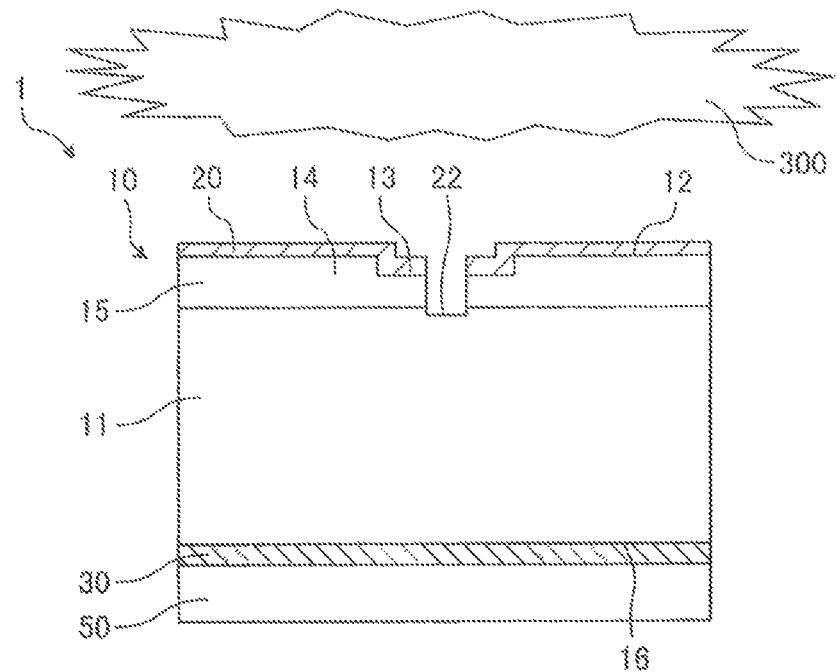
FIG. 7 is a cross-sectional view of a main portion of the device wafer illustrating an example of a plasma etching step indicated in FIG. 2.
Figure 8:
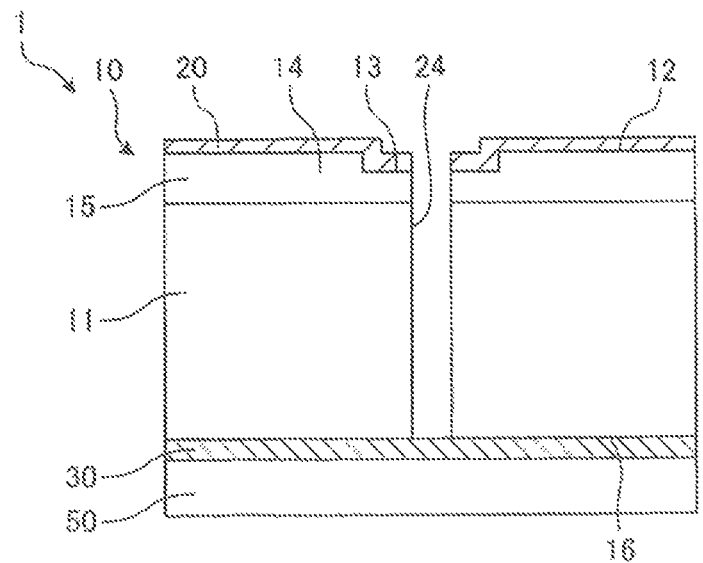
FIG. 8 is a cross-sectional view of a main portion of the device wafer illustrating a state after the plasma etching step in FIG. 7.

FIG. 7 is a cross-sectional view of a main portion of the device wafer 10 illustrating an example of the plasma etching step 1003 indicated in FIG. 2. FIG. 8 is a cross-sectional view of a main portion of the device wafer 10 illustrating a state after the plasma etching step 1003 in FIG. 7. The plasma etching step 1003 is carried out after the mask forming step 1002 is carried out. The plasma etching step 1003 is a step of supplying a gas 300 in a plasma condition to the front surface 12 of the device wafer 10 and forming a division groove 24 from which the substrate 11 is to be divided along each of the laser-processed grooves 22.

As illustrated in FIG. 7, in the plasma etching step 1003 of the preferred embodiment, a plasma apparatus supplies the gas 300 in a plasma condition to form the division groove 24 along each of the division lines 13 formed in the front surface 12 of the device wafer 10. In a case in which the substrate 11 is formed of silicon, the gas 300 is, for example, sulfur hexafluoride ($SF_6$), carbon tetrafluoride ($CF_4$), or the like, but the present invention is not limited to them. In addition, as the plasma etching method, a generally-called Bosch process may be used. The Bosch process is a method of alternately carrying out a step of supplying a sulfur hexafluoride gas in a plasma condition to form a division groove 24 by etching and a step of supplying an octafluorocyclobutane (c-$C_4F_8$) gas in a plasma condition to deposit a film on side surfaces and a bottom surface of the division groove 24. Further, in a case in which the substrate 11 is formed of gallium arsenide, a cycle etching method may be carried out in which etching and film deposition are alternately repeated by use of the gas 300 such as chlorine ($Cl_2$), silicon tetrachloride ($SiCl_4$), or boron trichloride ($BCl_3$). The plasma apparatus includes, for example, an electrostatic chuck (ESC), a chamber having the electrostatic chuck therein, an exhaust unit that vacuums the inside of the chamber, a gas supplying unit that supplies the gas 300 in a plasma condition inside the chamber. The chamber includes a gas supplying section that injects the gas 300 in a plasma condition which is supplied from the gas supplying unit into the inside of the chamber, above the electrostatic chuck. The plasma apparatus is not limited to the example described above, and such a plasma apparatus that causes the gas 300 to be in a plasma condition inside the chamber to thereby supply the gas 300 in a plasma condition to the device wafer 10, for example, is applicable.

In the plasma etching step 1003, first, through the protective tape 50, the back surface 16 side of the device wafer 10 is electrostatically attracted to the electrostatic chuck. In the plasma etching step 1003, then, the inside of the chamber is depressurized, while the gas 300 in a plasma condition is supplied in the chamber. At this time, the gas 300 in a plasma condition is supplied through the protective mask 20 from the front surface 12 side of the device wafer 10. The gas 300 in a plasma condition is supplied through the laser-processed groove 22 to the substrate 11 of the device wafer 10, thereby etching a groove bottom of the laser-processed groove 22 exposed from the protective mask 20 of the device wafer 10. The gas 300 in a plasma condition etches the laser-processed groove 22, and as illustrated in FIG. 8, a division groove 24 is formed. The division groove 24 is etched to the back surface 16 side of the substrate 11, and the substrate 11 is separated along each division groove 24, whereby the adhesive film 30 is exposed at the bottom of the division groove 24.

(Expanding Step 1004)

Figure 9:
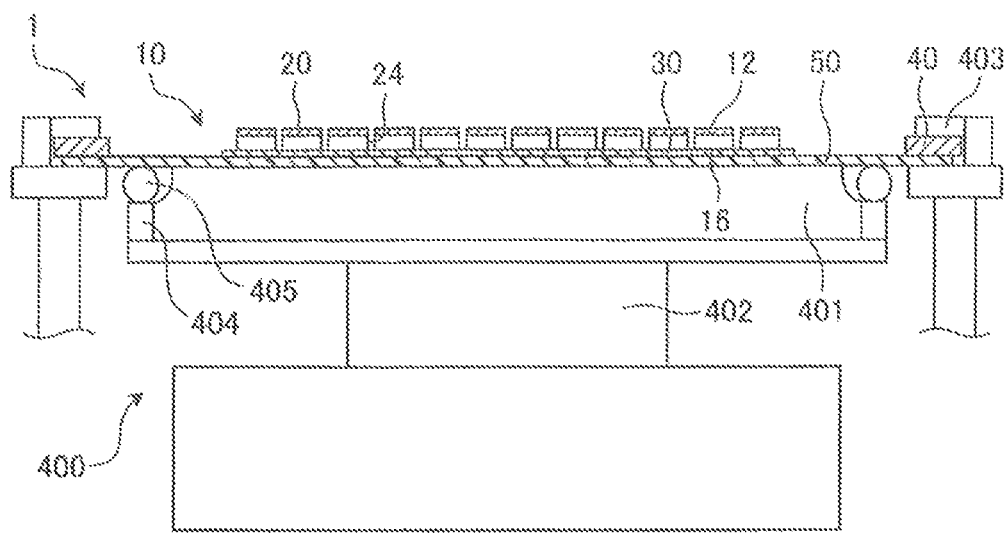
FIG. 9 is a side elevational partial sectional view illustrating a state of an expanding step indicated in FIG. 2.
Figure 10:
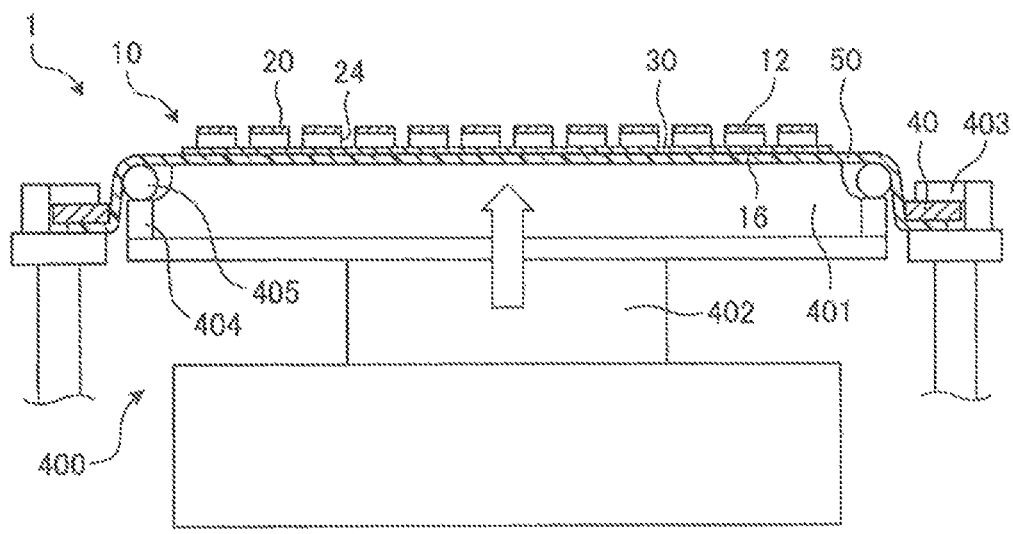
FIG. 10 is a side elevational partial sectional view illustrating a state subsequent to the state in FIG. 9 in the expanding step indicated in FIG. 2.
Figure 11:
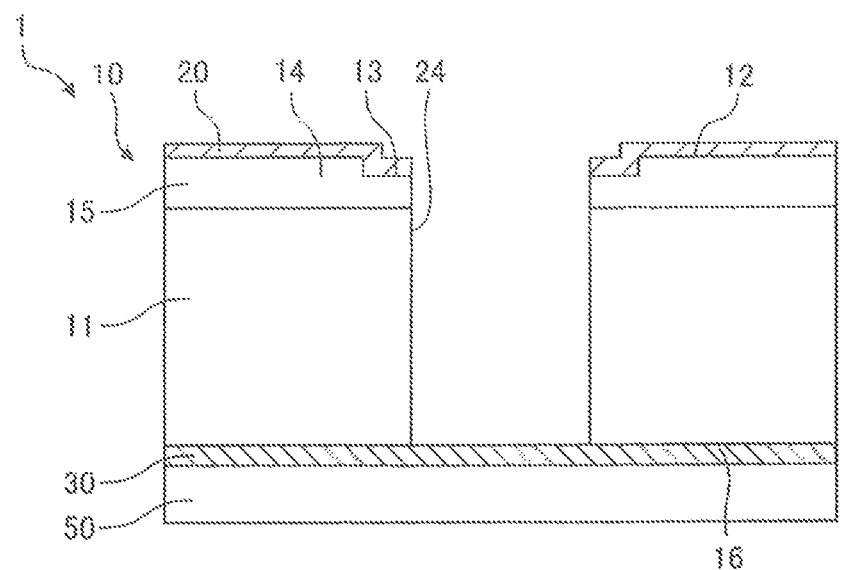
FIG. 11 is a cross-sectional view of a main portion of the device wafer of FIG. 10.
Figure 12:
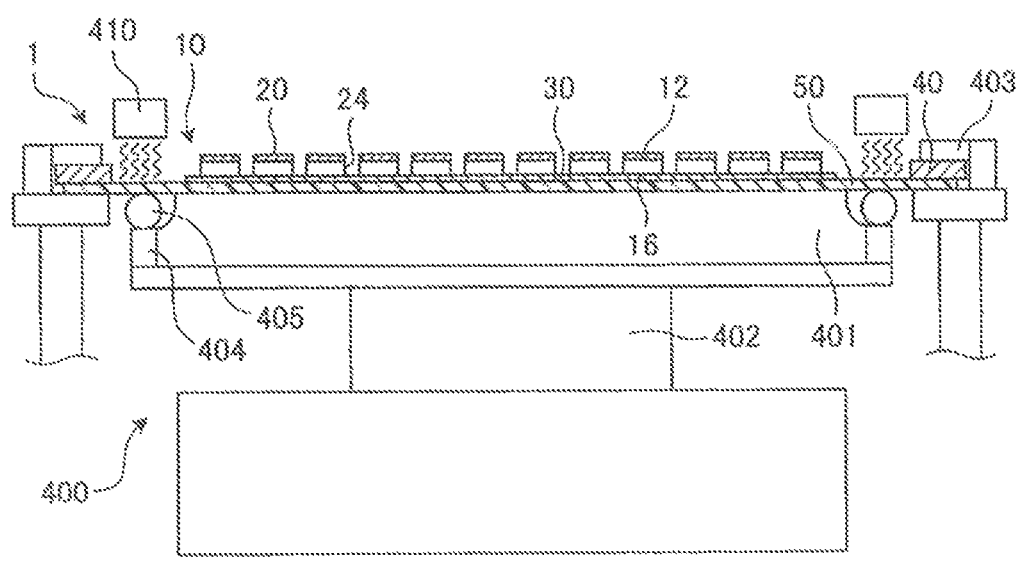
FIG. 12 is a side elevational partial sectional view illustrating a state subsequent to the state in FIG. 10 in the expanding step indicated in FIG. 2.

FIG. 9 is a side elevational partial sectional view illustrating a state of the expanding step 1004 indicated in FIG. 2. FIG. 10 is a side elevational partial sectional view illustrating a state subsequent to the state in FIG. 9 in the expanding step 1004 indicated in FIG. 2. FIG. 11 is a cross-sectional view of a main portion of the device wafer 10 of FIG. 10. FIG. 12 is a side elevational partial sectional view illustrating a state subsequent to the state in FIG. 10 in the expanding step 1004 indicated in FIG. 2. The expanding step 1004 is carried out after the plasma etching step 1003 is carried out. The expanding step 1004 is a step of expanding the protective tape 50 in a plane direction and expanding each width of the division grooves 24.

As illustrated in FIG. 9, FIG. 10, and FIG. 11, in the expanding step 1004 of the preferred embodiment, an expanding apparatus 400 applies an external force to the protective tape 50 in a radial direction, thereby expanding each width of the division grooves 24. The expanding apparatus 400 includes a holding table 401, an elevating unit 402, a plurality of clamps 403, a pushup member 404, and a plurality of roller members 405. The pushup member 404 is provided at an outer periphery of the holding table 401 coaxially and has a cylindrical shape. The roller member 405 is rotatably provided in a plane flush with or slightly higher than a holding surface of the holding table 401 and at an upper end of the pushup member 404.

As illustrated in FIG. 10, in the expanding step 1004, first, the adhesive film 30 side of the back surface 16 of the device wafer 10 is placed through the protective tape 50 on the holding surface of the holding table 401, and the outer peripheral portion of the annular frame 40 is fixed with the clamps 403. At this time, the roller members 405 are in contact with the protective tape 50 between an inner edge of the annular frame 40 and an outer edge of the adhesive film 30.

As illustrated in FIG. 11, in the expanding step 1004, then, the elevating unit 402 causes the holding table 401 and the pushup member 404 to move upward in an integrated manner. At this time, the protective tape 50 has the outer peripheral portion fixed with the clamps 403 through the annular frame 40, so that a portion of the protective tape 50 between the inner edge of the annular frame 40 and the outer edge of the adhesive film 30 is expanded in a plane direction. Moreover, the roller member 405 provided at the upper end of the pushup member 404 mitigates friction with the protective tape 50, and accordingly, the whole protective tape 50 is expanded in the plane direction.

In the expanding step 1004, as a result of the expansion of the protective tape 50, a tensile force is radially acted on the protective tape 50. When the radial tensile force is acted on the protective tape 50 with the adhesive film 30 attached to the front surface thereof, as illustrated in FIG. 12, a portion of the adhesive film 30 corresponding to each of the division grooves 24 is expanded. Thus, each width of the division grooves 24 is expanded. At this time, the portion of the protective tape 50 between the inner edge of the annular frame 40 and the outer edge of the adhesive film 30 has a linear shape in section from a lower surface of the annular frame 40 to an upper surface of the roller member 405.

In the expanding step 1004, then, the adhesive film 30 side of the back surface 16 of the device wafer 10 is sucked through the protective tape 50 on the holding table 401. In this manner, a state in which each width of the division grooves 24 is expanded is maintained.

As illustrated in FIG. 12, the elevating unit 402 causes the holding table 401 and the pushup member 404 to move downward in an integrated manner. At this time, the outer peripheral portion of the protective tape 50 is fixed to the clamps 403 through the annular frame 40, and a central portion of the protective tape 50 is sucked to the holding table 401. Accordingly, the radial tensile force acted on the protective tape 50 is decreased, the portion of the protective tape 50 between the inner edge of the annular frame 40 and the outer edge of the adhesive film 30 is slacked.

To eliminate this slack, in the expanding step 1004 of the preferred embodiment, the holding table 401 and the pushup member 404 are moved downward in an integrated manner, while the heating unit 410 heats the portion of the protective tape 50 between the inner edge of the annular frame 40 and the outer edge of the adhesive film 30. The heating unit 410 includes a heat source that radiates an infrared ray. The heat source heats the protective tape 50, moving along a circumferential direction of the portion of the protective tape 50 between the inner edge of the annular frame 40 and the outer edge of the adhesive film 30, for example. As a result, the portion of the protective tape 50 between the inner edge of the annular frame 40 and the outer edge of the adhesive film 30 is shrunk.

(Additional Coating Step 1005)

Figure 13:
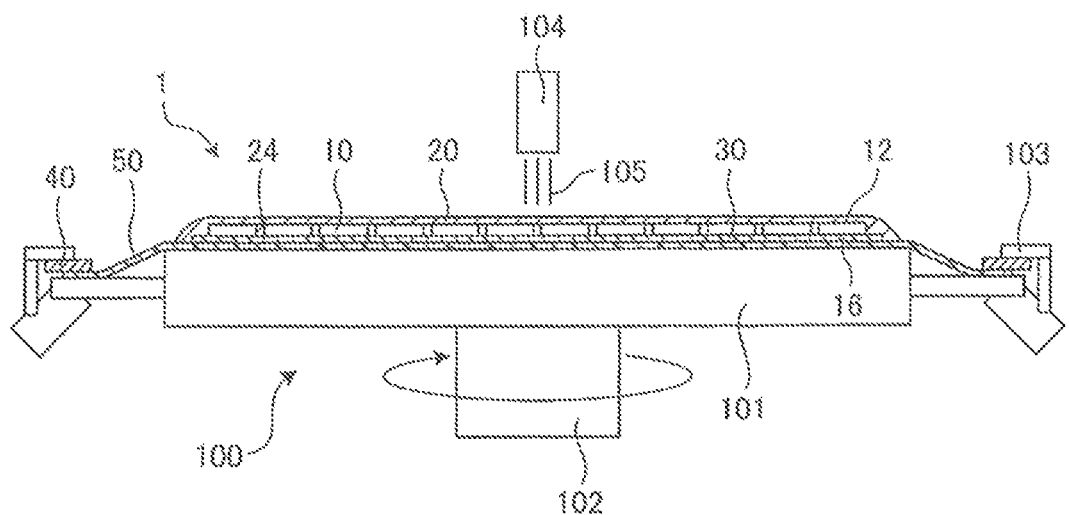
FIG. 13 is a side elevational partial sectional view illustrating an example of an additional coating step indicated in FIG. 2.
Figure 14:
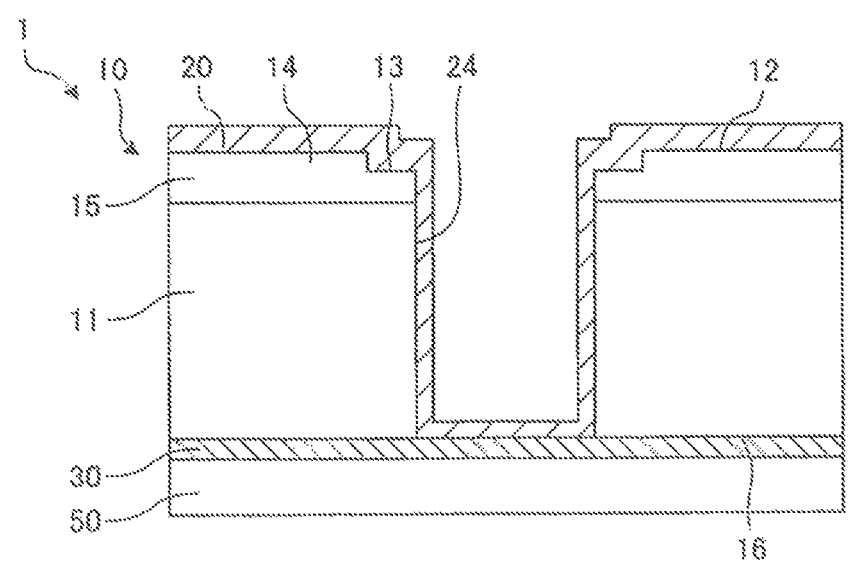
FIG. 14 is a cross-sectional view of a main portion of the device wafer illustrating a state after the additional coating step in FIG. 13.

FIG. 13 is a side elevational partial sectional view illustrating an example of the additional coating step 1005 indicated in FIG. 2. FIG. 14 is a cross-sectional view of a main portion of the device wafer 10 illustrating a state after the additional coating step 1005 in FIG. 13. The additional coating step 1005 is carried out after the expanding step 1004 is carried out in the embodiment; however, in the present invention, the additional coating step 1005 may be carried out at any timing as long as the additional coating step 1005 is carried out after the plasma etching step 1003 and before the adhesive film dividing step 1006. The additional coating step 1005 is a step of applying the water-soluble resin 105 to the device wafer 10 with the division grooves 24 formed therein.

As illustrated in FIG. 13, in the additional coating step 1005 of the preferred embodiment, the spin coater 100 used in the mask coating step 1001 coats the front surface 12 of the device wafer 10 and the division grooves 24 with the water-soluble resin 105. A process of applying the water-soluble resin 105 by the spin coater 100 is similar to the mask coating step 1001, and accordingly, a description thereof is omitted. The water-soluble resin 105 is additionally applied to the device wafer 10 having the division grooves 24 formed therein, and accordingly, as illustrated in FIG. 14, not only the front surface 12 of the device wafer 10, but also side surfaces of the substrate 11 which are exposed due to the formation of the division grooves 24, are coated with the protective mask 20 made of layers of the water-soluble resin 105.

(Adhesive Film Dividing Step 1006)

Figure 15:
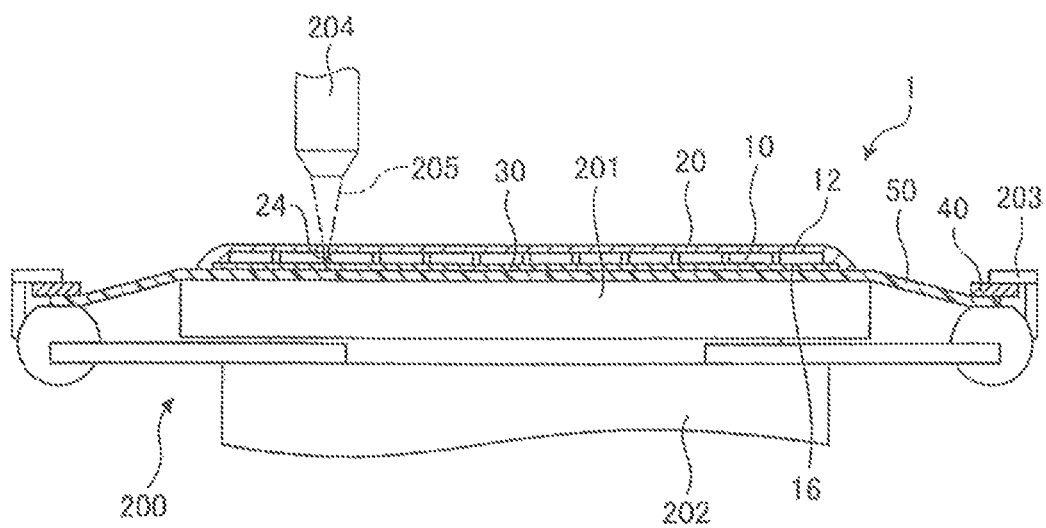
FIG. 15 is a side elevational partial sectional view illustrating an example of an adhesive film dividing step indicated in FIG. 2.
Figure 16:
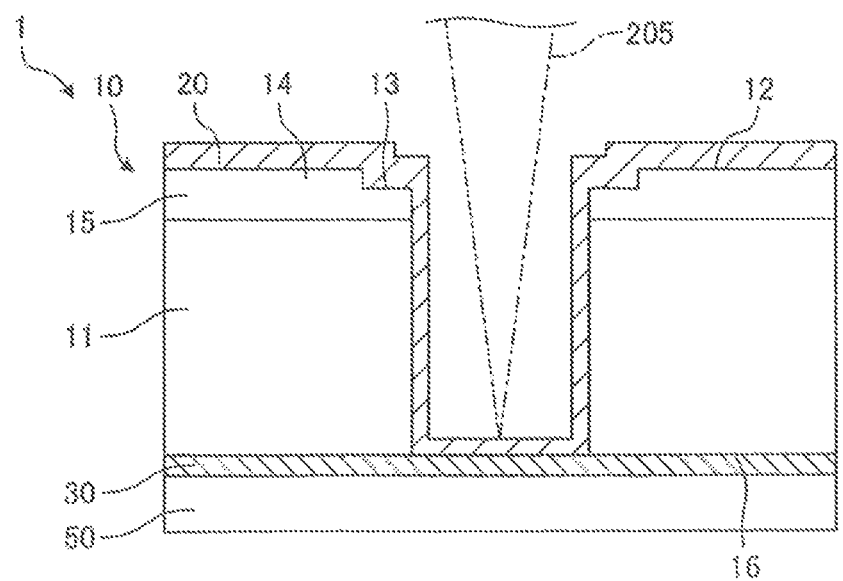
FIG. 16 is a cross-sectional view of a main portion of the device wafer of FIG. 15.
Figure 17:
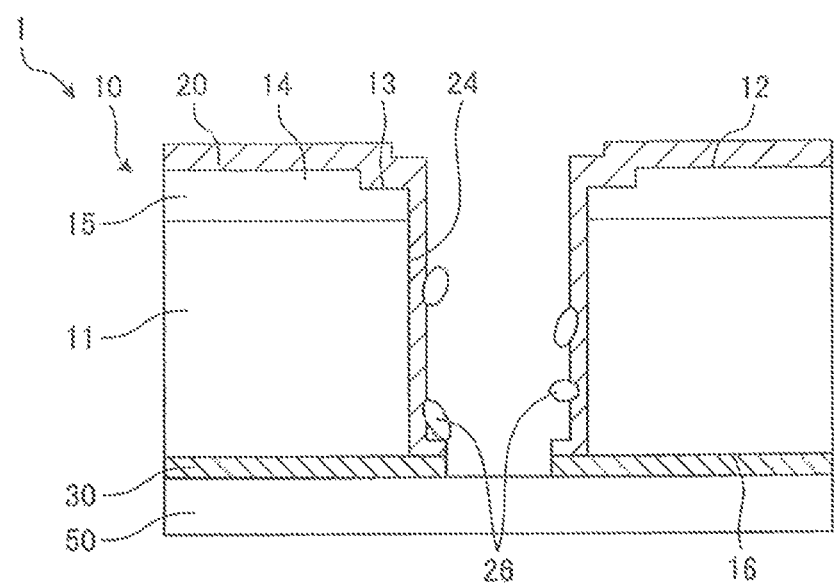
FIG. 17 is a cross-sectional view of a main portion of the device wafer illustrating a state after the adhesive film dividing step of FIG. 15.

FIG. 15 is a side elevational partial sectional view illustrating an example of the adhesive film dividing step 1006 indicated in FIG. 2. FIG. 16 is a cross-sectional view of a main portion of the device wafer 10 of FIG. 15. FIG. 17 is a cross-sectional view of a main portion of the device wafer 10 illustrating a state after the adhesive film dividing step 1006 of FIG. 15. In the preferred embodiment, the adhesive film dividing step 1006 is carried out after the additional coating step 1005 is carried out in the embodiment; however, in the present invention, the additional coating step 1005 may be omitted, and the adhesive film dividing step 1006 may be carried out after the expanding step 1004 is carried out. The adhesive film dividing step 1006 is a step of applying a laser beam 205 to the adhesive film 30 that has been exposed due to the formation of the division groove 24 to divide the adhesive film 30 along the division groove 24.

As illustrated in FIG. 15, in the adhesive film dividing step 1006 of the preferred embodiment, ablation processing carried out by the laser processing apparatus 200 used in the mask forming step 1002 divides the adhesive film 30 along each of the division grooves 24. The process of applying the laser beam 205 along each of the division grooves 24 by the laser processing apparatus 200 is similar to the process of applying the laser beam 205 along each of the division lines 13 in the mask forming step 1002, and accordingly, a description thereof is omitted. Application of the laser beam 205 along each of the division grooves 24 divides the adhesive film 30 that has been exposed due to the formation of the division groove 24, along the division groove 24, as illustrated in FIG. 16. At this time, debris 26 generated by the laser processing in the division groove 24 is attached to the protective mask 20 made of the water-soluble resin 105 which is applied to side surfaces of the division groove 24.

(Cleaning Step 1007)

Figure 18:
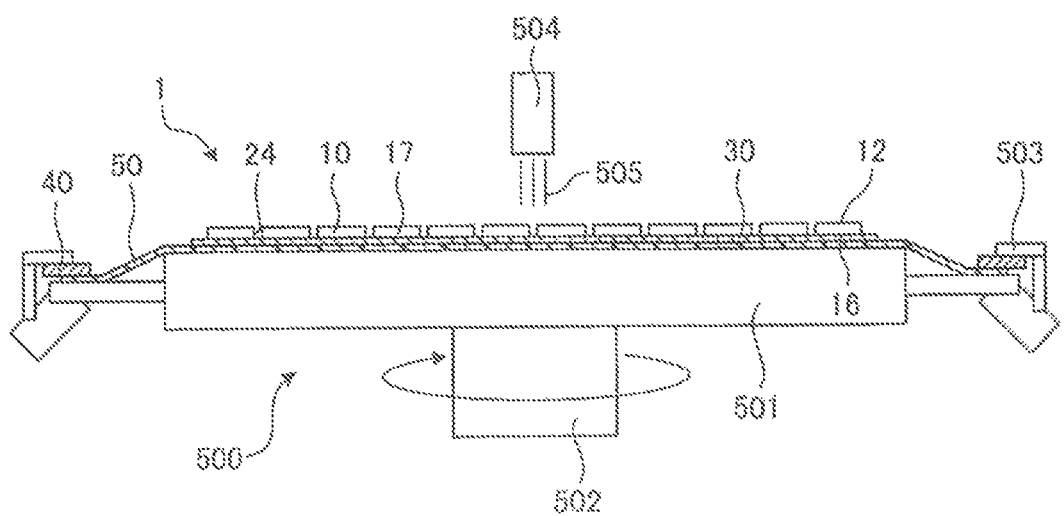
FIG. 18 is a side elevational partial sectional view illustrating an example of a cleaning step indicated in FIG. 2.
Figure 19:
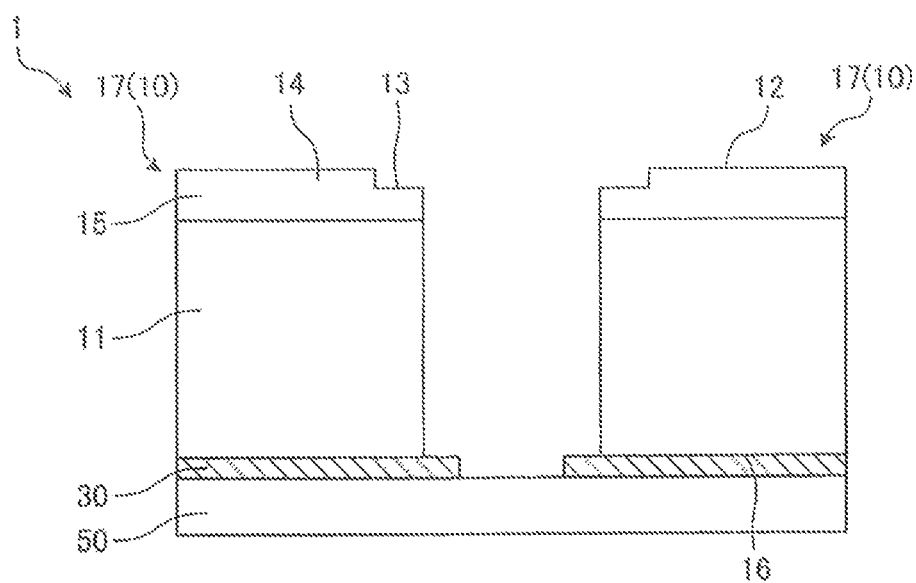
FIG. 19 is a cross-sectional view of a main portion of the device wafer illustrating a state after the cleaning step of FIG. 18.

FIG. 18 is a side elevational partial sectional view illustrating an example of the cleaning step 1007 indicated in FIG. 2. FIG. 19 is a cross-sectional view of a main portion of the device wafer 10 illustrating a state after the cleaning step 1007 of FIG. 18. The cleaning step 1007 is carried out after the adhesive film dividing step 1006 is carried out. The cleaning step 1007 is a step of cleaning the protective mask 20 made of the water-soluble resin 105 to remove the protective mask 20.

As illustrated in FIG. 18, in the cleaning step 1007 of the preferred embodiment, a cleaning apparatus 500 cleans the protective mask 20 made of the water-soluble resin 105 covering the front surface 12 of the device wafer 10 and side surfaces of the device chip 17, with a cleaning water 505 to remove the protective mask 20. The cleaning apparatus 500 includes a holding table 501, a rotary shaft 502, a plurality of clamps 503, and a cleaning water supplying nozzle 504.

In the cleaning step 1007, first, the back surface 16 side of the device wafer 10 is held under suction on the holding table 501 through the protective tape 50, and the outer peripheral portion of the annular frame 40 is fixed with the clamps 503. In the cleaning step 1007, then, in a state in which the holding table 501 is rotated around an axis thereof with the rotary shaft 502, the cleaning water 505 is supplied from the cleaning water supplying nozzle 504 toward the front surface 12 of the device wafer 10.

The cleaning water supplying nozzle 504 supplies the cleaning water 505 while moving in the radial direction of the device wafer 10 in a reciprocating manner. The supplied cleaning water 505 flows toward the outer periphery from the center on the front surface 12 of each device 14 of the device wafer 10 due to a centrifugal force caused by rotation of the holding table 501, thereby dissolving the protective mask 20 made of the water-soluble resin 105 covering the front surface 12 of each device 14 and the side surfaces of each device chip 17. In the cleaning step 1007, by dissolving the protective mask 20 made of the water-soluble resin 105 covering the front surface 12 of each device 14 of the device wafer 10 and the side surfaces of each device chip 17, the front surface 12 of each device 14 and the side surfaces of each device chip 17 are exposed.

The cleaning water 505 is a pressurized water a water pressure of which is adjusted to substantially 10 to 12 MPa at a water channel on the upstream of the cleaning water supplying nozzle 504. The cleaning water 505 is a liquid in the preferred embodiment; however, in the present invention, the cleaning water 505 may be a fluid obtained by mixing an air with a liquid. The cleaning water 505 is a pure water, for example.

As has been described above, the processing method of the device wafer 10 according to the preferred embodiment includes the mask coating step 1001, the mask forming step 1002, the plasma etching step 1003, the expanding step 1004, the adhesive film dividing step 1006, and the cleaning step 1007. The processing method of the device wafer 10 according to the preferred embodiment may include the additional coating step 1005 between the plasma etching step 1003 and the adhesive film dividing step 1006.

In the processing method of the device wafer 10 according to the preferred embodiment, after the device wafer 10 with the adhesive film 30 attached thereto is divided in the plasma etching step 1003, the adhesive film 30 and the protective tape 50 are expanded in the expanding step 1004. Accordingly, the division grooves 24 formed in the plasma etching step 1003 are expanded, so that a width of the adhesive film 30 exposed at the bottom of each of the division grooves 24 is expanded. As a result, application of the laser beam 205 to the adhesive film 30 in each of the division grooves 24 becomes easy, so that the device chip 17 with the adhesive film 30 attached thereto can be easily manufactured.

Moreover, in the processing method of the device wafer 10 according to the preferred embodiment, the water-soluble resin 105 in a liquid condition which prevents the debris 26 generated in the laser processing on the adhesive film 30 from being attached is used as the protective mask 20 in the plasma etching step 1003. Accordingly, there is produced an advantageous effect that the protective mask 20 for dicing in the plasma etching step 1003 can be used for the protective mask 20 for ablation processing by the laser beam 205 in the mask forming step 1002 and the adhesive film dividing step 1006.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing method of a device wafer which has a functional layer layered on a front surface of a substrate, the functional layer having a plurality of devices and a plurality of division lines formed therein, the plurality of division lines demarcating the plurality of devices and crossing each other, the processing method comprising:
   a mask coating step of coating, after a state in which an adhesive film for die-bonding attached to a back surface of the device wafer is attached to a front surface of a protective tape mounted to an annular frame is prepared, a front surface of the device wafer with a water-soluble resin as a protective mask;
   a mask forming step of, after the mask coating step is carried out, applying a laser beam to the front surface of the device wafer, forming a groove along each of the division lines by ablation processing, and removing the protective mask and the functional layer to expose the substrate;
   a plasma etching step of, after the mask forming step is carried out, supplying a gas in a plasma condition to the front surface of the device wafer to form a division groove that divides the substrate along the groove;
   an expanding step of, after the plasma etching step is carried out, expanding the protective tape in a plane direction to expand a width of the division groove, thereby forming an expanded division groove;

an adhesive film dividing step of, after the expanding step is carried out, applying a laser beam to the adhesive film that has been exposed due to the formation of the expanded division groove, and dividing the adhesive film along the expanded division groove by ablation processing; and a cleaning step of, after the adhesive film dividing step is carried out, cleaning and removing the water-soluble resin.

2. The processing method of a device wafer according to claim 1, further comprising:

an additional coating step of applying the water-soluble resin to the device wafer that has the division groove formed therein, after the plasma etching step is carried out and before the adhesive film dividing step is carried out.

3. The processing method of a device wafer according to claim 1, further comprising:

a contracting step, after the expanding step, of contracting the protective tape in the opposite plane direction as the expanding step while still maintaining the expanded division groove, wherein a heating unit heats a portion of the protective tape between an inner edge of the annular frame and an outer edge of the adhesive film during the contracting step.

4. The processing method of a device wafer according to claim 1, wherein, during the expanding step, a holding surface of a holding table applies a uniform external force in a radial direction to the protective tape.

5. The processing method of a device wafer according to claim 1, wherein, during the expanding step, a plurality of roller members press against the protective tape.

* * * * *